United States Patent [19]

Fan et al.

[11] 4,357,183

[45] Nov. 2, 1982

[54] HETEROEPITAXY OF GERMANIUM SILICON ON SILICON UTILIZING ALLOYING CONTROL

[75] Inventors: John C. C. Fan, Chestnut Hill; Ronald P. Gale, Bedford, both of Mass.

[73] Assignee: Massachusetts Institute of Technology, Cambridge, Mass.

[21] Appl. No.: 177,567

[22] Filed: Aug. 13, 1980

[51] Int. Cl.$^3$ ............................................ H01L 21/228
[52] U.S. Cl. .................................. 148/181; 148/177; 148/180; 156/612; 156/DIG. 64; 156/DIG. 67; 156/DIG. 105; 357/16
[58] Field of Search .............. 148/1.5, 176, 177, 179, 148/181, 180, 174; 156/612, DIG. 64, DIG. 67, DIG. 80, DIG. 88, DIG. 102, DIG. 103, DIG. 105; 357/16

[56] References Cited

U.S. PATENT DOCUMENTS

| | | | |
|---|---|---|---|
| 2,910,394 | 10/1959 | Scott et al. | 148/1.5 X |
| 3,102,828 | 9/1963 | Courvoisier | 148/175 X |
| 3,242,018 | 3/1966 | Grabmaier et al. | 148/181 |
| 3,309,553 | 3/1967 | Kroemer | 148/175 X |
| 3,338,760 | 8/1967 | Brownson | 148/175 |
| 3,615,855 | 10/1971 | Smith et al. | 148/175 X |
| 3,984,857 | 10/1976 | Mason | 148/175 X |
| 3,993,533 | 11/1976 | Milnes et al. | 156/613 |
| 4,116,751 | 9/1978 | Zaromb | 156/612 X |

OTHER PUBLICATIONS

Kryuger et al., "Solid-Phase Epitaxy of Ge on (III) Si", Sov. Phys. Dokl 23 (12), Dec. 1978, pp. 925-926.
Vasilevskaya et al., "Imperfections .... Si-Sie-Ge ... System", Thin Solid Films, 32 (1976), pp. 371-373.
Lav et al., "Heteroepitaxy of Deposited Amorphous Layer .... Irradiation", Appl. Phys. Lett. 33 (3), Aug. 1 1978, pp. 235-237.
Golecki et al., "Heteroepitaxy ... Amorphous Germanium ... Silicon . .", Thin Solid Films, 57 (1979), L13-L15.
Vasilevskaya et al., "Structural .... Si/Ge Heterojunctions", Thin Solid Films, vol. 55, 1978, pp. 229-234.
Vasilevskaya et al., "Effect of Growth .... Si-Ge ... System", IBID, vol. 30, 1975, pp. 91-98.
Chu et al., "Gallium Arsenide Films on Recrystallized Germanium Films", J. Applied Physics, vol. 48, No. 11, Nov. 1977, pp. 4848-4849.
Kurata et al., "Study on Making Abrupt Heterojunctions ....", J. electro Chem. Soc., vol. 115, No. 8, Aug. 1968, pp. 869-874.
Kasper et al., "One-Dimensional Si Ge Superlattice .. . . Epitaxy", J. Applied Physics, vol. 8, 1975, pp. 199-205.

Primary Examiner—L. Dewayne Rutledge
Assistant Examiner—W. G. Saba
Attorney, Agent, or Firm—Arthur A. Smith, Jr.; Leo R. Reynolds

[57] ABSTRACT

A method and apparatus is described for producing Ge or a $Ge_{1-x}Si_x$ heteroepitaxy film on Si by depositing films of Ge or $Ge_{1-x}Si_x$ on Si and subjecting the body so formed to a controlled temperature environment, wherein the body is rapidly (within a time period $t_o$ of more than about 100 microseconds) brought to a predetermined temperature within the alloy range of the deposited film but less than the melting point of Si. The body is then held at such temperature for a relatively short time not to exceed about 3 minutes, including the time period $t_o$.

5 Claims, 4 Drawing Figures

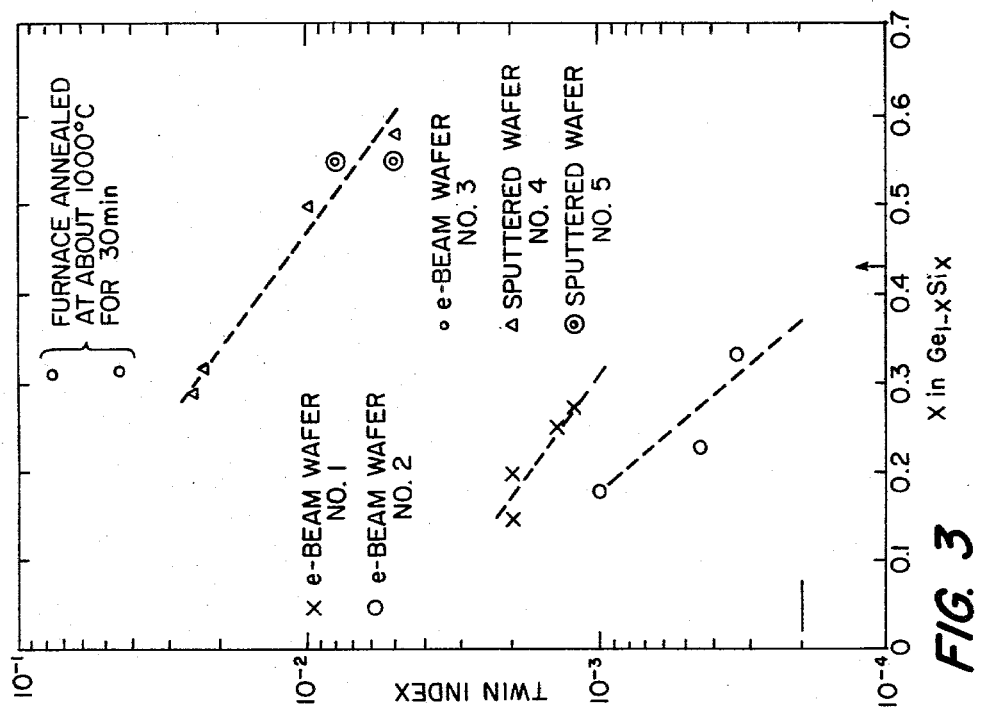
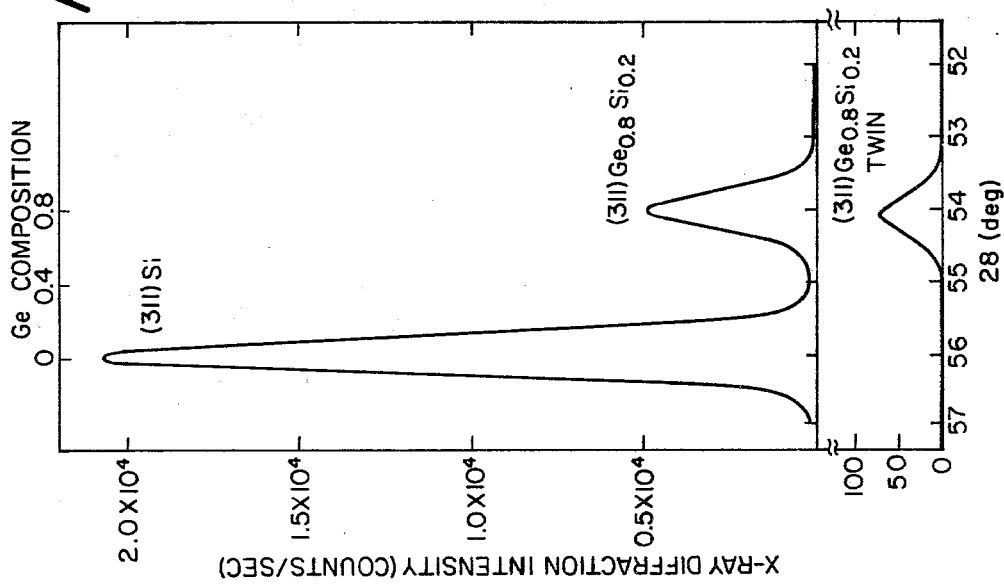

HETEROEPITAXY OF GERMANIUM SILICON ON SILICON UTILIZING ALLOYING CONTROL

The Government has rights in this invention pursuant to Contract Number AF19(628)-80-C-0002 awarded by the U.S. Department of the Air Force.

DESCRIPTION

1. Technical Field

The technical field is fabrication of semiconductors.

2. Background Art

Thin-film gallium arsenide (GaAs) cells have been formed on single crystal germanium (Ge) substrates with excellent conversion efficiencies for use as solar cells. Because of the lower cost and availability, it would be desirable to form such cells on silicon (Si). However, unlike Ge, Si is not well lattice-matched with GaAs. Furthermore, the thermal expansion coefficient of Si is about half that of GaAs. Therefore, the growth of GaAs directly on silicon is difficult without some way to relieve the stress inherent at the GaAs/Si interface.

One alternative is to provide a Ge-Si alloy layer intermediate the GaAs cell and Si substrate. Since Ge and Si are totally miscible, a heteroepitaxial alloy layer of Ge and Si can be formed with a composition ranging from Si-rich at the silicon substrate, hence a good lattice match, and Ge-rich at the GaAs interface, also presenting a good lattice match. The resultant Ge-Si alloy on Si body would then provide a substrate upon which GaAs would be deposited using conventional techniques.

Previous efforts to produce heteroepitaxial Ge films on Si have used either pulsed electron beam techniques, as described in Applied Physics Letter 33(3) 1 August 1978 "Heteroepitaxy of Deposited Amorphous Layer By Pulsed Electron Beam Irradiation" by Lau et al or pulsed laser annealing as described in Thin Solid Films 57 L13 (1970) "Heteroepitaxy of a Deposited Amorphous Germanium Layer on a Silicon Substrate by Laser Annealing" by Golecki et al. Such films were found to have a number of defects. Another more expensive and time consuming process is represented by direct epitaxial deposition of germanium on silicon by molecular beam epitaxy such as shown in Thin Solid Films 55(1978) "The Structure and Electrical Characteristics of Si-Ge Heterojunctions" V. N. Vashlevskaya et al.

It is also known that alloys of germanium-silicon can be formed by hot-press techniques or furnace alloying. The hot-press technique is not acceptable for the reason that it does not produce an epitaxial structure, i.e.—single crystal film on a single crystal substrate. The furnace techniques heretofore employed have been reported as unsatisfactory for the reason that epitaxy is hindered by interfacial oxide and other impurities. (See, for example, Par. 2 of Golecki et al above referenced)

INVENTION DISCLOSURE

In the apparatus of the present invention a method and apparatus is provided which produces epitaxial films of Ge or Ge-Si on Si by rapidly heating deposited films of Ge or Ge-Si on Si in an inert ambient with a graphite strip heater. The crystalline quality of such films are excellent and the cost and complexity of the process is much less than the prior art electron beam or pulsed laser techniques.

In one embodiment, Ge and Si are co-deposited on a silicon substrate using well-known R. F. sputtering apparatus, and the ratio of Ge to Si are varied during deposition to produce a Si-rich composition at the Si substrate interface and a Ge-rich film composition at the external surface thus presenting a good lattice match for the silicon substrate and a good lattice match for subsequent growth of GaAs on the Ge-Si film.

While these results appear to contradict the experience of those skilled in the art, it is believed that the reason for the success of the present invention resides in (a) the relatively rapid temperature rise to a maximum temperature Tmax. to which the Ge-Si body is subjected as compared to conventional furnace techniques, (b) the close control over the heating and cooling process by use of thermocouple sensors in close proximity to the sample being processed and (c) the duration of time in which the body is maintained at Tmax.

For example, the samples are brought to a temperature sufficient to alloy the Ge-Si body, i.e. about 900° C.-1400° C. but less than the melting point of Si (about 1410° C.) in a time period of less than about 80 seconds. The body is then held at that temperature for a period ranging from more than 100 microseconds to less than three minutes.

DESCRIPTION OF FIGURES

FIG. 2 is a graph showing the X-ray diffraction patterns for a heat treated sample fabricated in accordance with the invention;

FIG. 3 is a graph showing the twin-index (TI) of various samples fabricated in accordance with the invention plotted as a function of the ratio of Ge and Si in the deposited film.

BEST MODE CONTEMPLATED

Figure 1:
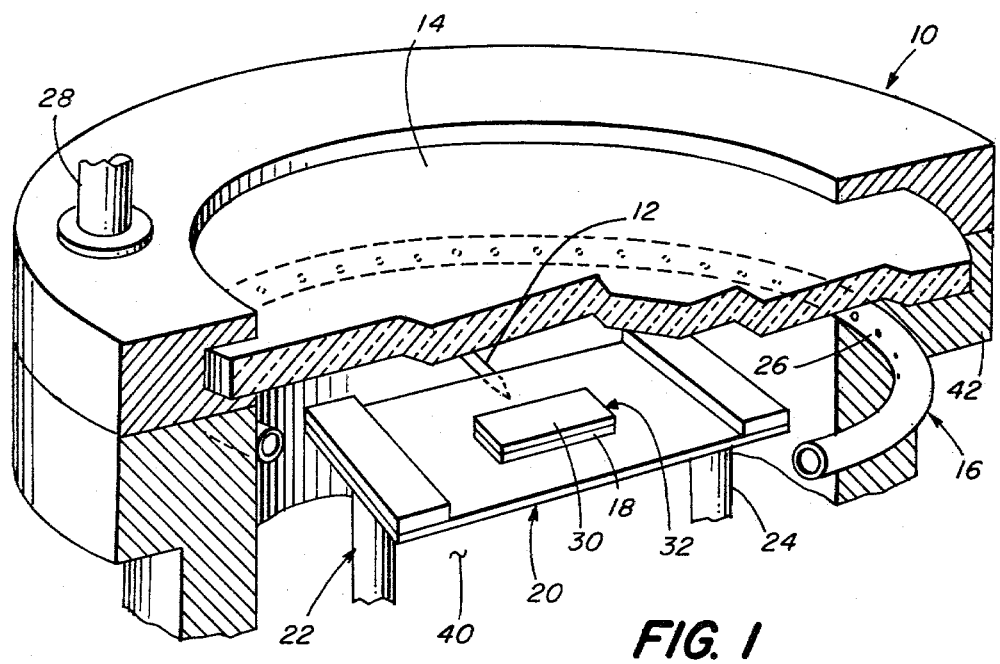
FIG. 1 is a schematicized view of a graphite strip heater furnace of the invention.

Referring now to the figures, and in particular to FIG. 1, there is shown an exploded view of a preferred embodiment of the invention. In the apparatus of FIG. 1 a body 32 consisting of a deposited layer 30 of Ge or codeposited $Ge_{1-x}Si_x$ on a Si substrate is processed in accordance with the invention. It should be noted that the subscript in the term $Ge_{1-x}Si_x$ denotes that, x, i.e., the atomic percentage of Si, may be varied in the range $0 \leq x \leq 1$.

The Si substrate 18 is a commercially available Si wafer with the front (top) surface polished for epitaxial growth and cleaned by conventional Si wafer processing techniques. Immediately prior to depositing the Ge or $Ge_{1-x}Si_x$ film, the Si wafer is rinsed with dilute HF before loading it into a vacuum system. Next, the Ge or a $Ge_{1-x}Si_x$ amorphous film is deposited on the Si wafer. This may be accomplished by well-known electron beam deposition or R.F sputtering techniques. A particularly useful R.F. sputtering system is described in "Thin Film Solids" 54 139 (1978) by Fan. Such a system utilizes a turbo-molecular pump and can be readily adapted to deposit Ge and Si simultaneously, thus allowing various Ge/Si alloys to be formed in the apparatus of FIG. 1.

The body 32 which is about 1 cm by 2 cm and 0.25 microns thick is now placed in the center of a 6 cm by 10 cm by 0.1 cm graphite strip heater 20. Strip heater 20 is provided with a pair of electrodes 22 and 24 which are connected through an air-tight seal to a source of alternating current (not shown).

An inert gas such as argon is pumped by means (not shown) into conduit 16 which encircles strip heater 20. Conduit 16 is provided with numerous openings spaced around the periphery of the ring formed by the conduit about the heater thus enabling a supply of inert gas to sweep away any non-inert gases present in the furnace chamber 40. The quality of the inert atmosphere should merely be such that no significant amount of oxides or nitrides will be formed in the process.

A chromel-alumel thermocouple 12 is provided immediately adjacent body 32 to sense the temperature and provide a digital readout on a meter (not shown). Coaxially surrounding the heater is a furnace body 42 with an optically transparent window 14 provided for viewing purposes.

The furnace body and mirror provide an airtight enclosure with a conduit 28 which can be used to evacuate noninert gases from the chamber 40.

In operation, AC voltage of 12 volts 350 amps. is coupled across heater terminals 22 and 24 causing the heater to rapidly rise in temperature and, by heat transfer mechanism, body 32 is likewise rapidly elevated in temperature. Preferably the body or sample 32 is heated to a maximum temperature of about 1000° C. within about 30 seconds. The temperature is monitored by means of signals received from thermocouple 12. In the apparatus of FIG. 1, about a 10° C. difference in temperature exists between the graphite strip and the sample. Alternatively, the temperature of the body could be directly monitored by well-known optical sensors. While it has been found important to achieve a very rapid alloying temperature of about 1000° C., it is also important that the melting point of silicon i.e. about 1410° C. not be reached. Furthermore, it has been found that excellent results are achieved when a cooling rate of 5° to 10° per second is maintained. This can be achieved by reducing the voltage applied to the heater terminals in a controlled manner.

As can be seen from the above description, the apparatus of the invention is much simpler and less expensive than either electron beam or laser irradiation techniques. Furthermore, electron beam or laser irradiation methods, while producing extremely fast increases normally within a few microseconds and decreases in temperature are not as readily controllable, i.e. the temperature of the body cannot be controlled within exact limits of ±10° C. as can the graphite strip heater apparatus. Also, the graphite strip-heating treatment results in a thermodynamically stable body since the thermal gradients occur more slowly and the entire body is subjected to heat treatment whereas with electron beam or laser irradiation the temperature profile is relatively localized. This stability feature is most important since it is intended that the heat-treated body will be subsequently subjected to about 700° C. in an epitaxial reaction during growth of a GaAs epitaxial layer.

Turning now to FIG. 2, there is shown a plot of the x-ray diffraction traces of a heat-treated Ge-coated Si sample (specifically a sample from wafer #4 of FIG. 3) processed in accordance with the invention.

The $Ge_{1-x}Si_x$ lattice of the sample is found to be oriented within 0.5° of the Si substrates, allowing for both peaks to be visible in a single $2\theta$ scan (where $\theta$=deflection angle of the incident x-ray with the normal to the plane of the sample). Since the lattice constants of different compositions of the Ge-Si system are well-known, the $Ge_{0.8}Si_{8.2}$ alloy composition can be readily obtained from the $2\theta$ angles. As shown in FIG. 2 there was no pure Ge diffraction peak.

The bottom plot of the x-ray trace of FIG. 2 is from the same sample illustrated in the upper trace except the sample has been tilted an additional 20° towards a (111) plane which corresponds to the position of a (311) plane in a twinned portion of this crystal. The peak signal is several orders of magnitude smaller in intensity than the epitaxial signal in the upper trace but shows the same $2\theta$ diffraction angle, indicating the presence of (111) twins in the alloy. The Si substrate shows no evidence of twinning.

FIG. 3 is a plot of twin indices (TI) versus atomic percentages x of Si in various sample $Ge_{1-x}Si_x$ alloys. TI is defined herein as the ratio of peak intensity of the (311) crystalline plane twin peak to the peak intensity of the (311) crystalline plane epitaxial-alloy peak and is representative or indicative of the degree of twinning in alloyed films. Twinning is a crystal phenomena involving the production of a lattice mirror image which detracts from the single crystal nature of epitaxial crystals and is to be avoided where single crystal growth is desired. A region of a crystal having a twinned area can result in a deterioration of the electrical properties in that area and is considered a crystal defect. All other things being equal or the same, it thus may be considered that the lower the TI the better the crystal. This has been confirmed by separate application of Rutherford-Backscattering techniques to samples showing a correlation between defect densities and TI. Samples from five wafers 1–5 are illustrated in FIG. 3. Wafers 1–3 were fabricated using E-Beam deposition of Ge on Si. Wafers 4–5 were fabricated using sputter deposition of Ge on Si.

It should be understood that a determination of the composition of the alloy samples plotted in FIG. 3 was made by obtaining x-ray diffraction traces of the samples. Since the lattice constants of different compositions of the Ge-Si alloy are well-known (See J. Phys. Chem. 68, 3021 (1964) U. P. Dimukes et al) the composition of the alloy resulting from the heat treatment process of the invention can be readily established from an x-ray analysis of the diffraction angles.

It was found that for wafers 1–3 which were prepared by electron beam deposition, the TI decreases as x increases. For example, the plot of wafer no. 2 shows that the TI decreased from ratios of about $10^{-3}$ for x approximately equal to 0.2 to less than the detection limit for the x-ray apparatus used (about $2 \times 10^{-4}$) for x approximately equal to 0.4.

Samples from wafers no 4 and 5 were sputter desposited using a turbo molecular pump and co-depositing Ge and Si with x equals 0.1. These samples also showed a decrease in TI as x increased. After heat treatment at about 1100° C. for 20 seconds the samples showed a decrease of TI from $2 \times 10^{-2}$ for x equals 0.3 to $5 \times 10^{-3}$ for x equals 0.6. It was found that the TI is about 2 orders of magnitude larger for sputtered samples than for electron-beam deposited samples for the same values of x. While the exact cause of the large difference is not yet known, it is suspected that the sputtered samples may contain some trapped argon gas which may impede the regrowth mechanism.

Figure 4:
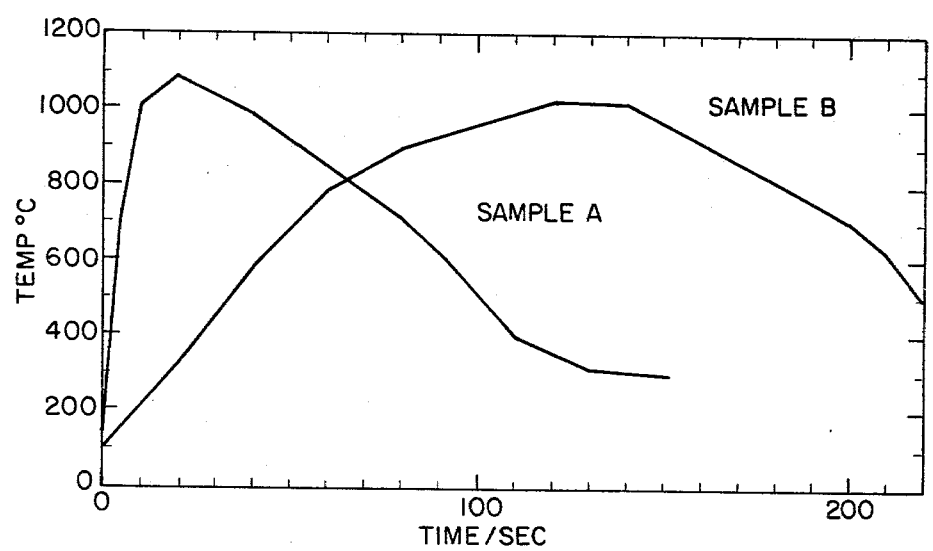
FIG. 4 is a graph showing the heat treatment of two samples in accordance with the invention.

Referring now to FIG. 4, which is a plot of two representative heat treatments, Sample A and Sample B in accordance with the invention. As may be seen in FIG. 4, Sample A was brought up to a temperature of 1000° C. within 10 seconds and to maximum temperature, $T_{max}$, approximately equal to 1090° C., within an additional 10 seconds and gradually lowered to 400° C. after an additional 90 seconds. The total time period ($t_o$) to bring the sample to its maximum temperature, $T_{max}$, was 10 seconds + 10 seconds or 20 seconds.

The plot of thermal cycle for Sample A represents the typical heat process to which the samples illustrated in FIG. 3 were subjected; except that in FIG. 3 various $T_{max}$ were used to obtain different values of x.

Sample B was more gradually brought to $T_{max}$, approximately equal to 1000° C., in about 100 seconds and held there for about 30 seconds and gradually lowered to 500° C. over about an 80 second period.

The resulting quality of the film produced by the Sample B heat treatment was substantially similar to that produced in accordance with the curve of Sample A. As long as the total time period between the time the body is brought and held at $T_{max}$ is less than about 3 minutes no significant degradation was observed. However, in commercial applications it will be preferable to bring the body to $T_{max}$ within a fairly short period of time, such as, 10-30 seconds.

In summary, then, there has been described heat treatment apparatus and processes for producing a substantially defect free heteroepitaxial alloy layer of Ge and Si on Si, which is relatively inexpensive, does not subject the body to excessive thermal shock and allows the crystalline structure to attain equilibrium but is more controllable than conventional furnace techniques and is accomplished in a shorter period. Using these alloy films as substrates, good epitaxial GaAs films have been deposited on the substrate in a conventional chemical vapor deposition reactor.

While the preferred embodiment shown is a batch process system where the body to be treated is held stationary and the temperature varied, it is contemplated that for large quantities it may be advisable to place the body on a conveyor which is passed through successive temperature zones resulting in a heat treatment equivalent to that described herein. Furthermore, while codeposition is recommended as a way to improve interfacial lattice match, it has been found that this is not essential. Provided the thermal profile as taught herein is followed, a graded interface with the desired composition profile will be achieved.

It should be pointed out that although the melting point of Ge is about 900° C. and therefore normally alloying temperatures are usually above 900° C., it is contemplated that the alloying temperature may be lowered to below 900° C. by various means, such as depositing a $SiO_2$ overlayer on Ge, thus providing a stress on the Ge film and lowering its melting point.

Additionally, while we have limited the description herein to single crystal silicon it is anticipated that polycrystalline silicon wafers or low cost crystalline Si sheets, which are being developed for Si solar cells, may also be applicable to this invention.

Furthermore, it is contemplated that heteroepitaxial Ge alloys other than Ge-Si alloys may be formed on Si using the process described; for example, Ge-GaAs or Ge and a suitable dopant. In addition, thin films other than GaAs, such as $GaAs_yP_{1-y}$ could be lattice matched to a particular Ge-Si alloy.

It will thus be obvious to those skilled in the art that changes and other modifications may be made without departing from the invention in its broader aspects and therefore the aim in the appended claims is to cover all such changes and modifications as fall within the true spirit and scope of the invention.

We claim:
1. The method of fabricating a heteroepitaxial film on silicon comprising the steps of:
   a. depositing a film of germanium on a surface of a silicon substrate to provide a germanium silicon body;
   b. bringing the temperature of the body up to its alloy temperature range but less than the melting point of the silicon substrate within a period of longer than 100 microseconds and maintaining the temperature of the body at a predetermined temperature within said range which will produce an alloy having a predetermined ratio of Ge to Si, the duration of this step (b) being less than about 3 minutes; and
   c. thereafter allowing the body to achieve room temperature.
2. The method of claim 1 in which the temperature is maintained in the range of 900° C.–1400° C.
3. The method of fabricating a heteropitaxial film on silicon comprising the steps of:
   a. co-depositing a film of germanium and silicon on a surface of a silicon substrate to provide a germanium silicon body;
   b. bringing the temperature of the body up to its alloy temperature range but less than the melting point of the silicon substrate within a period of longer than 100 microseconds and maintaining the temperature of the body at a predetermined temperature within said range which will produce an alloy having a predetermined ratio of Ge to Si, the duration of this step (b) being less than about 3 minutes.
4. The method of either claim 1 or claim 3 in which the film includes a dopant.
5. The method of fabricating a heteroepitaxial Ge film on a Si substrate comprising:
   a. depositing a film of $Ge_{1-x}Si_x$ where $0 < X < 1$ and x is the atomic percentage of Si; on a Si substrate to form a $Ge_{1-x}Si_x$/Si body;
   b. subjecting the body to a predetermined temperature $T_{max}$ which is within the alloy temperature range of the film $Ge_{1-x}Si_x$ but is below the melting point of Si;
   c. maintaining said body at said $T_{max}$ for a period of time not to exceed about 3 minutes, including the time ($t_o$) it takes to bring said body to $T_{max}$, where $t_o$ is not less than about 100 microseconds; and
   d. allowing the body to cool to room temperature.

* * * * *